(12) United States Patent
Balakrishnan et al.

(10) Patent No.: US 10,224,403 B2
(45) Date of Patent: Mar. 5, 2019

(54) THIN-BASE HIGH FREQUENCY LATERAL BIPOLAR JUNCTION TRANSISTOR

(71) Applicant: INTERNATIONAL BUSINESS MACHINES CORPORATION, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 48 days.

(21) Appl. No.: 15/459,608

(22) Filed: Mar. 15, 2017

(65) Prior Publication Data

US 2018/0269289 A1    Sep. 20, 2018

(51) Int. Cl.
| | | |
|---|---|---|
| *H01L 29/10* | (2006.01) | |
| *H01L 29/06* | (2006.01) | |
| *H01L 29/735* | (2006.01) | |
| *H01L 29/66* | (2006.01) | |
| *H01L 23/66* | (2006.01) | |

(52) U.S. Cl.
CPC .......... *H01L 29/1008* (2013.01); *H01L 23/66* (2013.01); *H01L 29/0649* (2013.01); *H01L 29/6625* (2013.01); *H01L 29/735* (2013.01)

(58) Field of Classification Search
CPC . H01L 23/66; H01L 29/0649; H01L 29/1008; H01L 29/66; H01L 29/6625; H01L 29/735
See application file for complete search history.

(56) References Cited

U.S. PATENT DOCUMENTS

| | | |
|---|---|---|
| 2012/0205784 A1 | 8/2012 | Bedell et al. |
| 2012/0210933 A1 | 8/2012 | Hekmatshoar-Tabari et al. |
| 2012/0314485 A1* | 12/2012 | Cai ........................ G11C 11/41 365/156 |

OTHER PUBLICATIONS

Cai, J. et al., "SOI Lateral Bipolar Transistor with Drive Current >3mA/μm" 2013 IEEE SOI-3D-Subthreshold Microelectronics Technology Unified Conference (S3S) (Oct. 2013) pp. 1-2.
Shahrjerdi, D. et al., "Low-Temperature Epitaxy of Compressively Strained Silicon Directly on Silicon Substrates" Journal of Electronic Materials (2012) pp. 494-497, vol. 41, No. 3.
Yau, J.B. et al., "SiGe-on-Insulator Symmetric Lateral Bipolar Transistors" 2015 IEEE SOI-3D-Subthreshold Microelectronics Technology Unified Conference (S3S) (Oct. 2015) pp. 1-2.

* cited by examiner

*Primary Examiner* — Trang Q Tran
(74) *Attorney, Agent, or Firm* — Tutunjian & Bitetto, P.C.; L. Jeffrey Kelly

(57) ABSTRACT

A semiconductor device including a base region present within a fin semiconductor structure that is present atop a dielectric substrate. An epitaxial emitter region and epitaxial collector region are present on opposing sides and in direct contact with the fin semiconductor structure. An epitaxial extrinsic base region is present on a surface of the fin semiconductor substrate that is opposite the surface of the fin semiconductor structure that is in contact with the dielectric base.

11 Claims, 8 Drawing Sheets

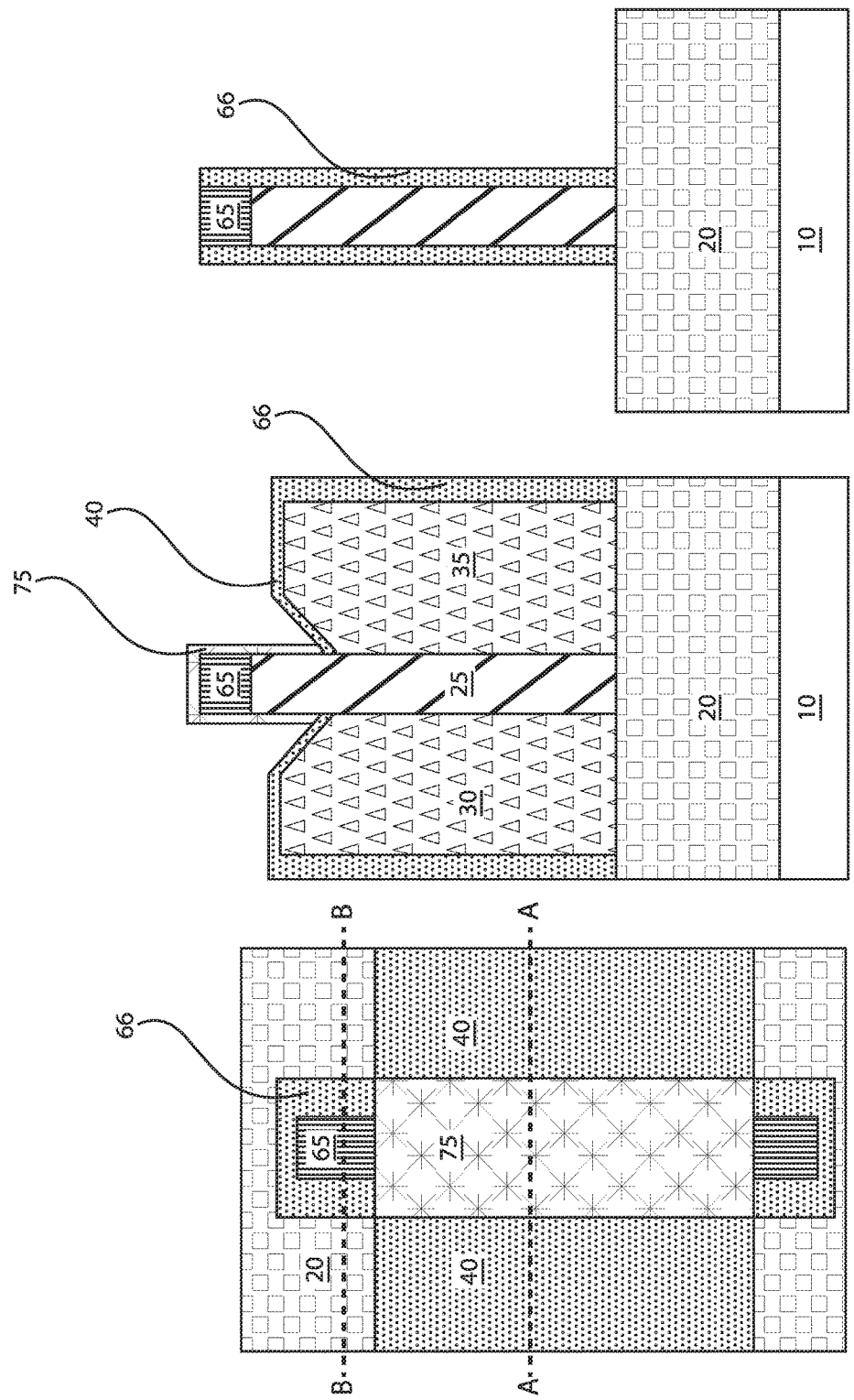

THIN-BASE HIGH FREQUENCY LATERAL BIPOLAR JUNCTION TRANSISTOR

BACKGROUND

Technical Field

The methods and structures described herein relate to semiconductor devices, such as bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, a thin base high frequency bipolar junction transistor is described herein. The base region of the bipolar junction transistor is thin because it is provided by a semiconductor fin structure. In one embodiment, the semiconductor device comprises a base region present within a fin semiconductor structure that is present atop a dielectric substrate. An epitaxial emitter region and epitaxial collector region are present on opposing sides and in direct contact with the fin semiconductor structure. An epitaxial extrinsic base region is present on a surface of the fin semiconductor substrate that is opposite the surface of the fin semiconductor structure that is in contact with the dielectric base.

In another embodiment, the semiconductor device comprises a base region present within a fin semiconductor structure that is present atop a dielectric substrate. The fin semiconductor structure has a width of 15 nm or less. An epitaxial emitter region and epitaxial collector region are present on opposing sides and in direct contact with the fin semiconductor structure. An epitaxial extrinsic base region is present on a surface of the fin semiconductor substrate that is opposite the surface of the fin semiconductor structure that is in contact with the dielectric base.

In another embodiment, a method of forming a semiconductor device is provided that includes forming a fin structure for the base region of a bipolar junction transistor. The method for forming the semiconductor device may include forming a fin structure having a first conductivity. A dielectric spacer is formed on an upper portion of the fin structure, in which the sidewalls of the fin structure are exposed. An emitter region and a collector region are formed on said exposed sidewalls on opposing sides of the fin structure using a low temperature deposition process.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 7A is a top down view depicting one embodiment of forming a sidewall spacer on the epitaxial emitter region and the epitaxial collector region.

FIG. 7B is a side cross-sectional view along section line A-A of FIG. 7A.

FIG. 7C is a side cross-sectional view along section line B-B of FIG. 7A.

DETAILED DESCRIPTION

Figure 1C:
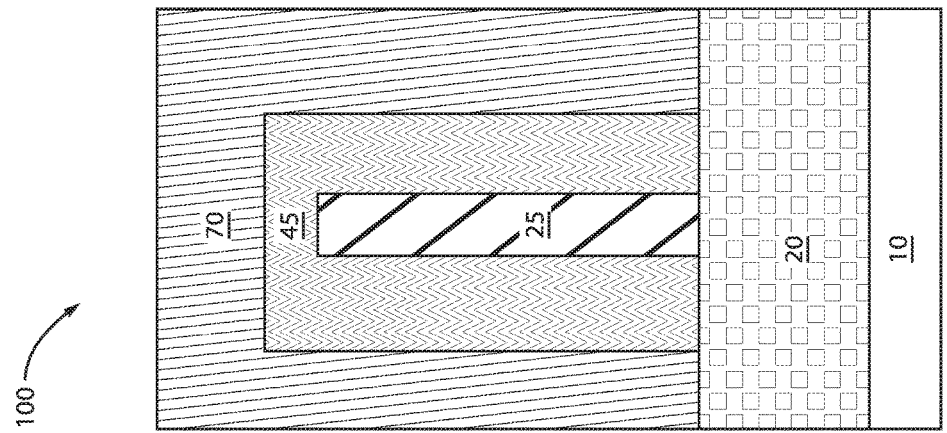
FIG. 1C is a side cross-sectional view along section line B-B of FIG. 1A.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two back-to-back P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed.

In some embodiments, the methods and structures described herein may provide a semiconductor on insulator (SOI) lateral bipolar junction transistor (L-BJT) fabricated with complementary metal oxide semiconductor (CMOS) compatible processes. The lateral bipolar junction transistor (L-BJT) provided herein may have a high drive current, e.g., >3 mA/µm, low stand-by power, and operation voltages scalable with the band gap of the base materials, such as silicon (Si), silicon germanium (SiGe), germanium (Ge), and combinations thereof. The BJT devices disclosed herein have narrow/thin base that allows for high frequency operation.

It has been determined that it can be challenging to make thin base structures without the occurrence of significant dopant diffusion from emitter and collector into base during fabrication. The methods described herein can limit the thermal budget at 450° with a maximum of 500° C., which allows for a novel structure of a thin-base bipolar junction transistor (BJT). For example, the base regions of the devices described herein may be present in fin structures having a width of less than 15 nm, which in some instances may range from 5 nm to 10 nm. In one example, the width of the fin structure containing the base region of the device may be equal to 8 nm.

The lateral BJT transistors that are described herein can operate at very high frequencies. For example, the L-BJT devices described herein may have a peak fT (the cutoff frequency) of 68 GHz or greater. Fin forming processes can provide, i.e., form, thin base regions with well-controlled width and wafer-scale production. The high aspect ratio of base regions formed within semiconductor fin structures in combination with low-temperature epitaxy emitter and collector regions enable high-frequency operation of the L-BJT device while maintaining sufficient current density. The methods and structures of the present disclosure are now described with greater detail with reference to FIGS. 1A-8.

Figure 1B:
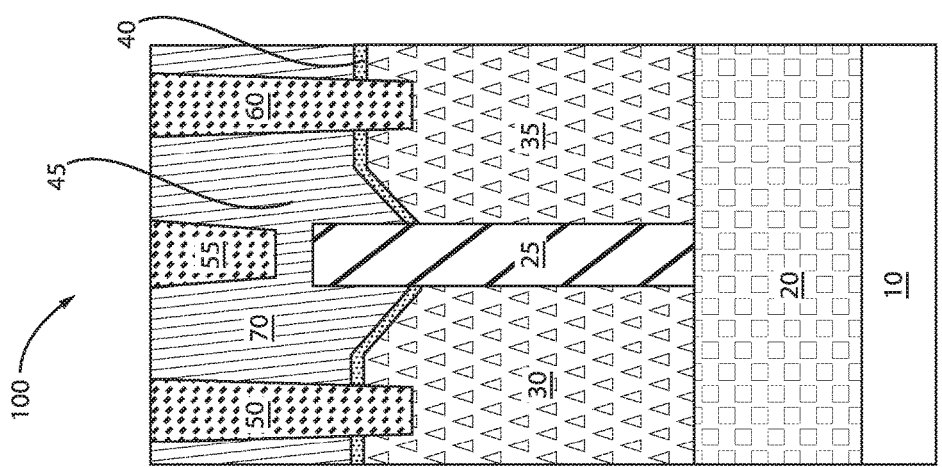
FIG. 1B is a side cross-sectional view along section line A-A of FIG. 1A.
Figure 1A:
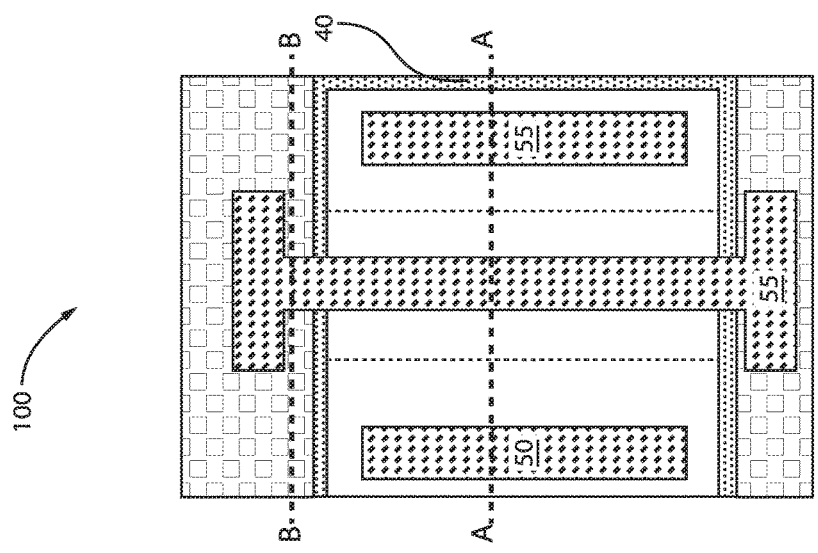
FIG. 1A is a top down view of one embodiment of a lateral bipolar junction transistor having a base region present within a fin structure.

FIGS. 1A-1C illustrate one embodiment of a lateral bipolar junction (L-BJT) device 100 that includes a base region present within a fin semiconductor structure 25 that is present atop a dielectric surface 20 of a substrate 10. The fin semiconductor structure 25 may have a width W1 of less than 15 nm. In some embodiments, the fin semiconductor structure 25 may have a width W1 ranging from 5 nm to 10 nm. In one example, the fin semiconductor structure 25 will have a width W1 that is equal to 8 nm. It is noted that the above examples for the width W1 of the fin semiconductor structure 25 is provided for illustrative purposes only, and is not intended to limit the present disclosure. For example, the width W1 of the fin semiconductor structure 25 that provides the base region for the lateral bipolar junction (L-BJT) device 100 described herein may be equal to 5 nm, 6 nm, 7 nm, 8 nm, 9 nm, 10 nm, 11 nm, 12 nm, 13 nm, 14 nm, and 15 nm, as well as any range of widths W1 having an upper value for the range selected from one of the aforementioned examples, and a lower value for the range selected from one of the aforementioned examples. The width W1 of the semiconductor fin structure 25 is substantially uniform along its entire height. This means that the width W1 of the semiconductor fin structure 25 at the top of the fin structure 25 is substantially the same, e.g., within +/−5%, of the width W1 of the semiconductor fin structure 25 at the base of the semiconductor fin structure 25. The width of the central, i.e., half the height, of the fin structure 25 is also the same as the width at the base and upper surfaces, as well as the width at the points therebetween. An epitaxial emitter region 30 and epitaxial collector region 35 are present on opposing sides and in direct contact with the fin semiconductor structure 25.

The base region may be present within a semiconductor fin structure 25 that can be composed of semiconductor material, e.g., type IV or type III-V semiconductor material. Examples of type IV semiconductor materials for the semiconductor fin structure 25 include silicon (Si), germanium (Ge) and silicon germanium (Ge). The semiconductor fin structure 25 may also be composed of indium phosphide (InP) or indium phosphide (InP) on silicon (Si). Other III-V semiconductor materials that can provide the semiconductor substrate may include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

The semiconductor fin structure 25 that provides the base region is typically composed of a crystalline material. For example, the semiconductor fin structure 25 is typically a single crystal material (also referred to as monocrystalline material). The term "single crystalline" denotes a crystalline solid, in which the crystal lattice of the entire sample is substantially continuous and substantially unbroken to the edges of the sample, with substantially no grain boundaries.

The base region that is provided by the semiconductor fin structure 25 is the region within the lateral bipolar junction transistor (LBJT) where a sufficient input current triggers a larger current from the emitter 30 to the collector 35 of the transistor. The role of the base region 25 is to function as an amplifier causing an emitter-to-collector current to be much larger than the base current. When the base receives an input current, a larger current then flows from the emitter region 30 to the collector region 35. In a bipolar junction transistor, current flows from the emitter region 30 to the collector region 35 and then out from the collector region 35.

The base region that is provided by the semiconductor fin structure 25 of the transistor has an opposite polarity, i.e., conductivity type, from the emitter region 30 and the collector region 35. The term "conductivity type" means that a region is either doped to an n-type conductivity or a p-type conductivity. For example, when the base region 25 is doped to an n-type conductivity, the emitter region 30 and the collector region 35 are doped to a p-type conductivity, and the transistor is referred to as a PNP bipolar transistor. In another example, when the base region 25 is doped to a p-type conductivity, the emitter region 30 and the collector region 35 are doped to an n-type conductivity, and the transistor is referred to as an NPN bipolar transistor.

Still referring to FIGS. 1A-1C, the emitter region 30 and collector region 35 are present on opposing sides of the base region 25. The emitter region 30 and collector region 35 are epitaxially formed semiconductor materials in an epitaxial relationship with the semiconductor fin structure 25 that provides the base region. The term "epitaxial" denotes that a material is formed using an epitaxial growth process. The terms "epitaxial growth and/or deposition" and "epitaxially formed" mean the growth of a material, such as a semiconductor or dielectric, on a deposition surface of a semiconductor material, in which the material being grown has the same crystalline characteristics, e.g., crystalline plane orientation, as the semiconductor material of the deposition surface. For example, the emitter region 30 and collector region 35 may have the same orientation of crystal plane as the semiconductor fin structure 25. For example, both the semiconductor fin structure 25 and the emitter/collector regions 30, 35 may have the orientation of a (100) crystal plane. In other embodiments, both the semiconductor fin structure 25, and the emitter/collector regions 30, 35 may have the orientation of a (110) crystal plane. Because the emitter and collector regions 30, 35 are formed using an epitaxial deposition process, the emitter region 30 may also be referred to as an epitaxial emitter region and the collector region 35 may also be referred to as an epitaxial collector region.

In some embodiments, the semiconductor material for the emitter region 30 and the collector region 35 of the device may be the same composition as the composition of the semiconductor material that provides the semiconductor fin structure 25 that provides the base region of the device. In other embodiments, the semiconductor material for the emitter region 30 and the collector region 35 of the device may be a different composition from the composition of the semiconductor material that provides the semiconductor fin structure 25 that provides the base region of the device. For example, the materials for the semiconductor fin structure 25 may include silicon (Si), germanium (Ge), silicon germanium (Ge), indium phosphide (InP), aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AnInAs), aluminum indium antimonide (AlInSb), gallium arsenide nitride (GaAsN), and combinations thereof. In some embodiments, the material that is selected for the semiconductor material of the emitter region 30 and the collector region 35 may have a larger band gap than the semiconductor fin structure 25 that provides the base region. The term "band gap" refers to the energy difference between the top of the valence band (i.e., EV) and the bottom of the conduction band (i.e., EC).

Still referring to FIGS. 1A-1C, the L-BJT device 100 may further include an extrinsic base region 45 that is present atop the semiconductor fin structure 25 that provides the base contact of the device. The extrinsic base region 45 is typically formed of a silicon or germanium containing semiconductor material, such as silicon, single crystal silicon, polycrystalline silicon, polycrystalline germanium, polycrystalline silicon germanium, single crystal germanium, single crystal silicon germanium and combinations thereof. The extrinsic base region 45 is typically doped to a same conductivity type as the base region, i.e., semiconductor fin structure 25. For example, if the base region is doped to an n-type conductivity, the extrinsic base region 45 is also doped to an n-type conductivity. The dopant concentration of the dopant that dictates the conductivity type of the extrinsic base region 45 is typically greater than the dopant concentration that dictates the conductivity type of the base region, i.e., semiconductor fin structure 25. For example, the dopant concentration of the n-type or p-type dopant in the extrinsic base region 45 may range from $4 \times 10^{19}$ atoms/cm$^3$ to $6 \times 10^{21}$ atoms/cm$^3$. In another example, the dopant concentration of the n-type or p-type dopant in the extrinsic base region 45 may range from $1 \times 10^{20}$ atoms/cm$^3$ to $1 \times 10^{21}$ atoms/cm$^3$.

Referring to FIGS. 1A-1C, the L-BJT device 100 may further include spacers 40 of a dielectric material, such as an oxide, nitride, oxynitride material or low-k dielectric material, are present on the at least the upper surfaces of the emitter region 30 and the collector region 35 that separate these regions from the extrinsic base region 45. Examples of materials suitable for low-k dielectric spacers 40 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The L-BJT device 100 that is depicted in FIGS. 1A-1C may be present on a semiconductor substrate 10 composed of a type III-V semiconductor material or type IV semiconductor material. The semiconductor substrate 10 is typically composed of a single crystalline material. In some embodiments, when the fin structure 25 is formed from the upper semiconductor layer of an SOI substrate, a buried oxide layer 20 may separate the semiconductor fin structure 25 from the semiconductor substrate 10. In some embodiments, the buried oxide layer 20 may be composed of silicon dioxide (SiO$_2$). In some embodiments, the buried oxide layer 20 may have a thickness ranging from 20 nm to 200 nm. The buried oxide layer 20 may provide a dielectric surface region atop the semiconductor substrate. In other embodiments, the buried oxide layer 20 may also be provided by a dielectric layer that is deposited on a semiconductor containing substrate. The L-BJT device 100 may also include via contacts 50, 55, 60 extending through an inter-level dielectric 70 to the emitter region 30, collector region 35 and the extrinsic base region 45 of the device. FIGS. 2-8 depict one embodiment of a method for forming the LBJT devices 100 depicted in FIGS. 1A-1C.

Figure 2:
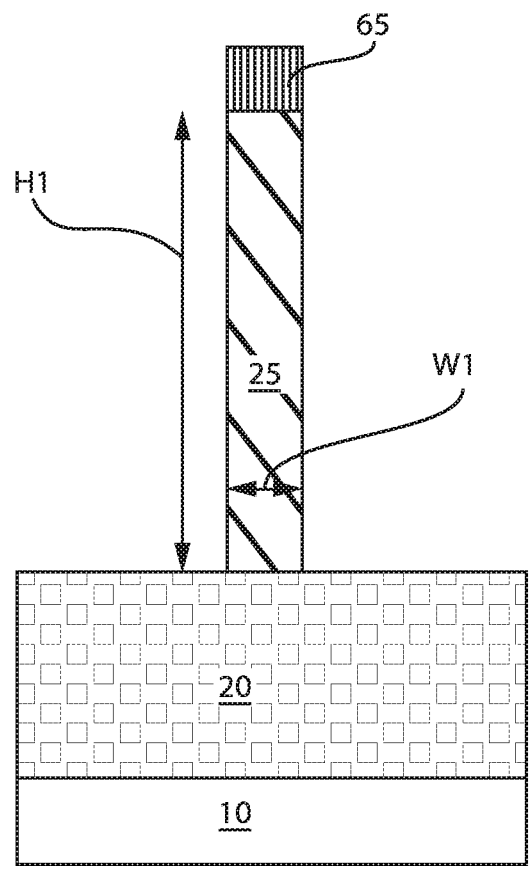
FIG. 2 is a side cross-sectional view depicting one embodiment of a fin structure for producing a bipolar junction transistor (BJT).

FIG. 2 depicts one embodiment of forming a fin structure 25 for the base region of a lateral bipolar junction transistor. The fin structures 25, i.e., semiconductor fin structures 25, may be formed using deposition, photolithography and etch processes. In some embodiments, the semiconductor fin structures 25 are formed from the semiconductor on insulator (all) layer, i.e., upper semiconductor layer, of a semiconductor on insulator (SOI) substrate. SOI substrates typically include a buried oxide layer 20 that separates the SOI layer from a base semiconductor substrate 10. The SOI layer of the SOI substrate that provides the fin structure 25 may be composed of a type IV semiconductor material or a type III-V semiconductor material. For example, when the SOI layer is silicon, the SOI substrate is a silicon on insulator substrate, and the fin structure 25 that is formed therefrom is composed of silicon (Si). When the SOI layer is silicon germanium (SiGe), the SOI substrate is a silicon germanium on insulator (SGOI) substrate, and the fin structure 25 that is formed from therefrom is composed of silicon germanium (SiGe). In other embodiments, the substrate used to form the semiconductor fin structures 25 is a III-V on insulator substrate, in which the upper semiconductor layer that is separated from a base semiconductor layer is composed of a III-V semiconductor. In this instance, the semiconductor fin structure 25 is composed of a III-V semiconductor.

It is not necessary that the substrate structure used to provide the fin structures 25 is an SOI, SGOI or type III-V on insulator substrate. In other embodiments, the starting structure includes a base semiconductor substrate 10 that is a bulk semiconductor substrate, which may be composed of a type IV or a type III-V semiconductor material. A dielectric layer is then deposited on the upper surface of the base semiconductor substrate 10, which provides a dielectric upper surface, on the base semiconductor substrate 10 similar to the buried dielectric layer of an SOI substrate. The dielectric layer functions similar to the above described buried oxide layer 20, and provides a dielectric surface on the underlying bulk semiconductor substrate. The dielectric layer may be an oxide, e.g., silicon oxide, nitride, e.g., silicon nitride, or oxynitride material layer. The dielectric layer may be deposited using chemical vapor deposition methods, such as plasma enhanced chemical vapor deposition (PECVD). A semiconductor layer may then be deposited on the dielectric layer. The semiconductor layer is deposited to a thickness that provides the height for the semiconductor fin structure 25. The semiconductor layer in this substrate structure formed using depositions steps is similar the SOI layer of the SOI substrate.

A hardmask layer may then be formed atop the upper semiconductor layer, e.g., SOI layer, to provide the dielectric fin cap 65 that is present atop the semiconductor fin structure 25. Any dielectric material may be present in the dielectric fin cap 25. For example, the dielectric fin cap 25 may be provided by an oxide, e.g., silicon oxide, or nitride, e.g., a silicon nitride. The hardmask layer may be deposited using chemical vapor deposition process, such as chemical vapor deposition (CVD).

Following formation of the hardmask layer, an etch mask may be formed over the hard mask layer that is patterned to define the dielectric fin cap 65 using an etch process. The etch mask may be a photoresist mask that is formed using deposition, photolithography and development steps. The width of the etch mask is selected to provide the width of the dielectric fin cap 65, in which the dielectric fin cap 65 can be used to etch the semiconductor layer to provide the semiconductor fin structure. 25.

Following formation of the etch mask, the pattern of the etch mask may be transferred into the hardmask layer to provide the dielectric fin cap 65. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. In some embodiments, the etch process may be an etch process including a chemistry that is selective to the semiconductor material for the semiconductor fin structure 25. In this example, following patterning the hardmask dielectric layer to provide the dielectric fin cap 65, a second etch process may etch the semiconductor layer that provides the semiconductor fin structures 25. The etch process for defining the semiconductor fin structures 25 may be selective to the dielectric surface layer 20 on the semiconductor substrate 10. In some embodiments, the etch mask may be removed prior to etching the semiconductor material for defining the semiconductor fin structures 25. In some embodiments, the etch mask may be removed after etching the semiconductor material for defining the semiconductor fin structures 25.

In some other embodiments, the etch process for defining the dielectric fin cap 65 may also etch the semiconductor material layer that provides the fin structures 25, to dictate the geometry of the semiconductor fin structures 25. In this embodiment, the etch process may remove the material of the hardmask that provides the dielectric fin cap 65 and the material that provides the semiconductor fin structures 25 selectively to the dielectric surface layer 20 on the semiconductor substrate 10. The etch mask may then be removed.

The semiconductor fin structure 25 may have a height H1 ranging from 5 nm to 200 nm. In another embodiment, the semiconductor fin structure 25 has a height H1 ranging from 10 nm to 100 nm. In one example, the semiconductor fin structure 10 has a height H1 ranging from 20 nm to 50 nm. The fin structure 25 may have a width W1 of less than 15 nm. In another embodiment, the fin structure 25 has a width W1 ranging from 3 nm to 8 nm.

It is noted that the aforementioned process flow is only one example of forming a fin structure 25. In another embodiment, the fin structure 25 may be formed using a spacer image transfer (SIT) process.

The fin structure 25 is either doped to an n-type or p-type conductivity. The term "p-type" refers to the addition of impurities to an intrinsic semiconductor that creates deficiencies of valence electrons. As used herein, "n-type" refers to the addition of impurities that contributes free electrons to an intrinsic semiconductor. In the embodiments, in which the base region 5 is composed of a type IV semiconductor material, such as silicon, polysilicon, germanium (Ge), or silicon germanium (SiGe), polysilicon germanium, examples of n-type dopants may include antimony, arsenic and phosphorous, and examples of p-type dopants may include boron, aluminum, gallium and indium. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, to provide abrupt junctions in a base region 5 composed of a type III-V semiconductor material, the dopants that dictate the n-type or p-type conductivity may include silicon (Si), iron (Fe), germanium (Ge) and combinations thereof. The dopant that provides the conductivity type of the fin structure 25 is introduced either by in situ doping or ion implantation.

Figure 3B:
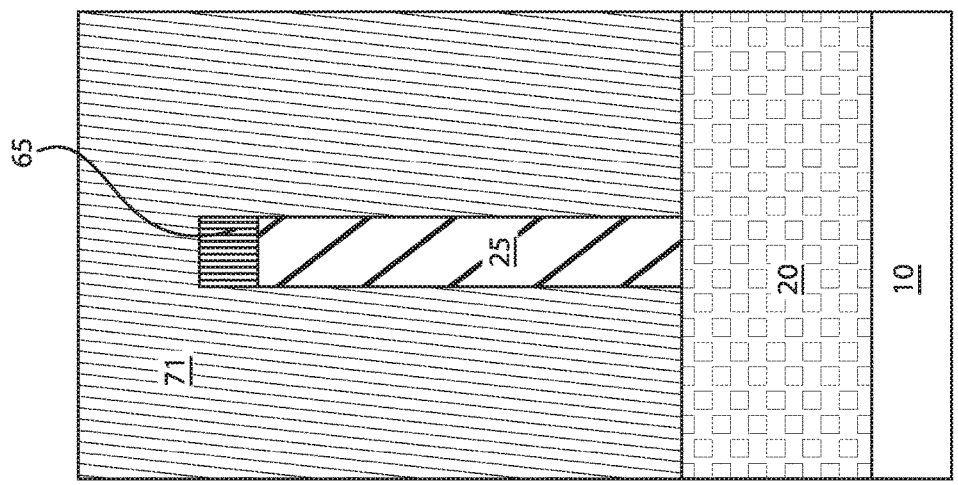
FIG. 3B is a side cross-sectional view along section line B-B of FIG. 3A illustrating one embodiment of a masked end portion of the fin structure depicted in FIG. 3A.
Figure 3A:
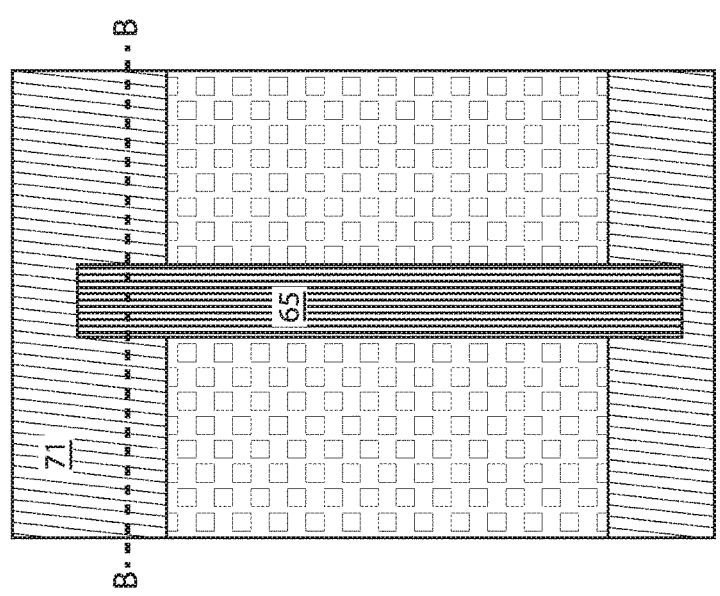
FIG. 3A is a top down view depicting one embodiment of masking end portions of the fin structure depicted in FIG. 2.

FIGS. 3A-3B depict one embodiment of masking end portions of the fin structure 25 depicted in FIG. 2. The mask 70 that is formed on the end portions of the fin structure 25 leave a center portion of the fin structure 25 exposed. In some embodiments, the mask 70 may be a photoresist mask. To provide the photoresist mask, a photoresist layer is first positioned the upper surfaces of the fin dielectric cap 65 and the semiconductor fin structures 25. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. The developed photoresist mask is present over the edge portions of the semiconductor fin structures 25 leaving the central portions of the semiconductor fin structures 25 exposed, as depicted in FIG. 3A.

Figure 4B:
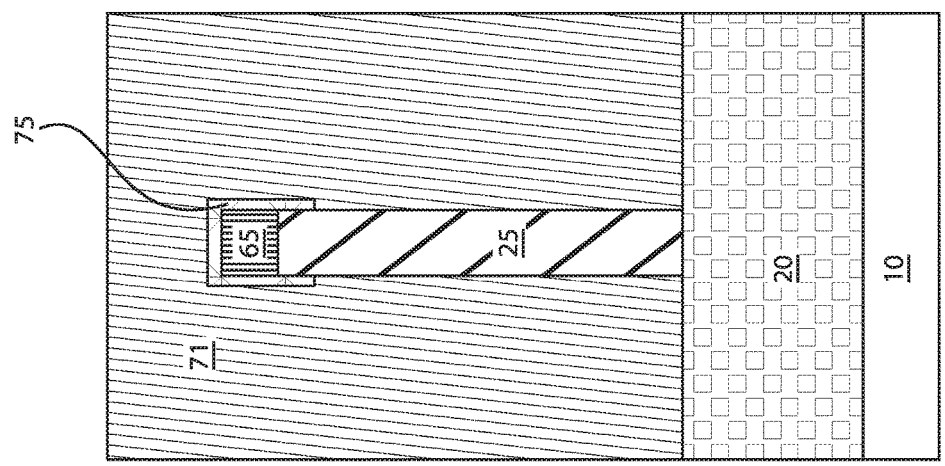
FIG. 4B is a side cross-sectional view along section line A-A of FIG. 4A.
Figure 4A:
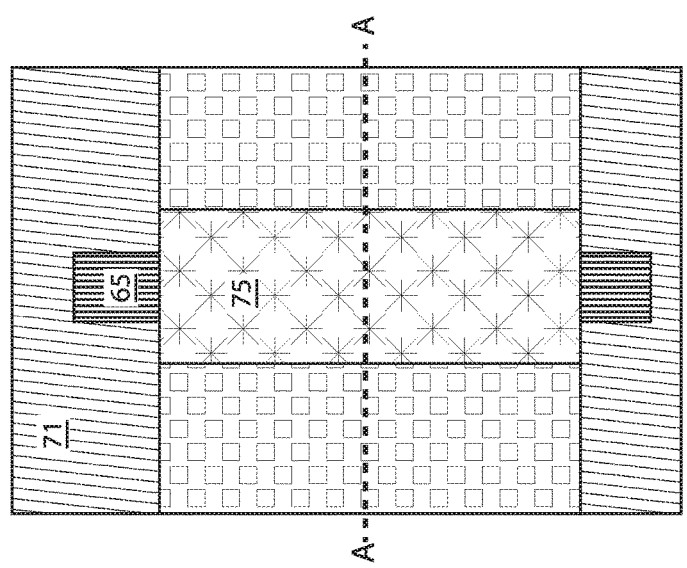
FIG. 4A is a top down view depicting one embodiment of forming a dielectric spacer on an upper portion of the fin structure, in which the sidewalls of the fin structure are exposed.

FIGS. 4A and 4B depict one embodiment of forming a dielectric spacer 75 on an upper portion of the fin structure 25, in which the sidewalls of the fin structure are exposed. The dielectric spacer 75 that is depicted in FIGS. 4A and 4B is hereafter referred to as a hanging dielectric spacer. The hanging dielectric spacer 75 is formed covering an end of the fin structure 25, i.e., upper end, on which the subsequently formed extrinsic base region is epitaxially formed. The hanging dielectric spacer 75 is only formed on the upper portion of the semiconductor fin structure 25, and leaves a majority of the sidewalls of the semiconductor fin structure 25 exposed to provide the epitaxial deposition surface for the subsequently formed epitaxial emitter region 30 and epitaxial collector region 35.

Forming the hanging dielectric spacer 75 may begin with forming a sacrificial blocking structure abutting the portions of the sidewalls of the semiconductor fin structure 25 that subsequently provide the deposition surfaces of the epitaxial emitter region 30 and the epitaxial collector region 35. The material for the sacrificial block structure may be any material that can be removed by an etching process that is selective to at least the semiconductor fin structure 25. For example, the sacrificial block structure may be composed of a photoresist material or may be a dielectric, such as silicon oxide or silicon nitride. The material that provides the sacrificial block structure may be deposited using chemical vapor deposition (CVD). In some embodiments, the material that provides the sacrificial block structure may deposited to a height as great as the height of the semiconductor fin structures 25. The sacrificial block structure has a height that protects the sidewall portions of the semiconductor fin structures 25, while leaving the portions of the semiconductor fin structures 25 that the extrinsic base region 45 is formed on exposed. To provide the correct height of the sacrificial block structure, the material that is deposited to provide the sacrificial block structure may be recessed by an etching process, such as reactive ion etch (RIE).

Following the formation of the sacrificial block structure, a conformal dielectric layer for the hanging dielectric spacer 75 may be deposited on at least the exposed sidewalls of the semiconductor fin structure 25 and the dielectric fin cap 65. The conformal dielectric layer for the hanging spacer 75 may also be formed on the upper surface of the sacrificial block structure. The hanging dielectric spacer 75 may include a dielectric material such as silicon oxide, silicon nitride, silicon oxynitride, organosilicate glass, or a combination thereof. The hanging dielectric spacer 75 can be formed, for example, by conformal deposition of a dielectric material layer and subsequent etch process. The term "conformal layer" denotes a layer having a thickness that does not deviate from greater than or less than 30% of an average value for the thickness of the layer. The conformal deposition of the dielectric material layer for the hanging dielectric spacer 75 can be performed, for example, by chemical vapor deposition (CVD), atomic layer deposition (ALD), or a combination thereof.

A photoresist mask may be formed protecting the portion of the conformal dielectric layer for the hanging spacer layer 75 that is present on the sidewalls of the fin structure 25, and the dielectric fin cap 65, wherein the horizontally orientated portions of the conformal dielectric layer that are present on the sacrificial blocking structure are removed by an etch process, such as reactive ion etching (RIE) or laser etching. The remaining portions of the conformal dielectric layer following the etch process provides the hanging spacer layer 75. The photoresist mask that is present over the hanging spacer layer 75 and the sacrificial blocking structure may be removed using a selective etch process or chemical stripping.

Figure 5B:
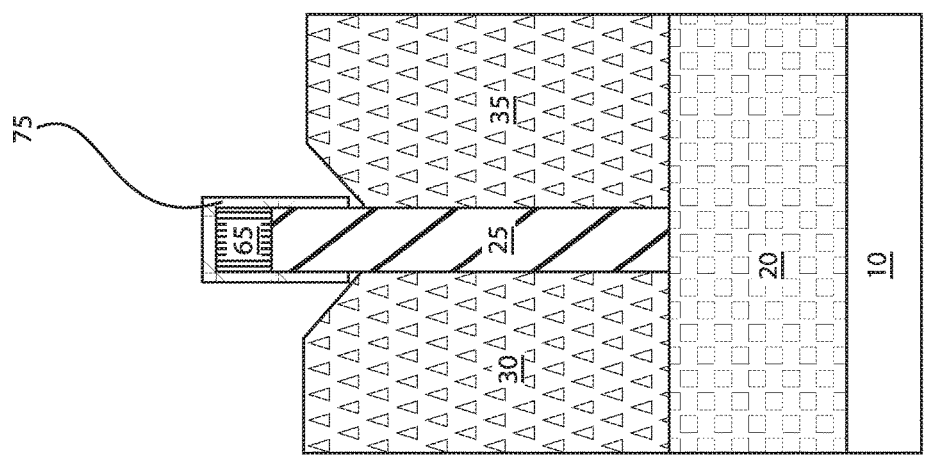
FIG. 5B is a side cross-sectional view along section line A-A of FIG. 5A.
Figure 5A:
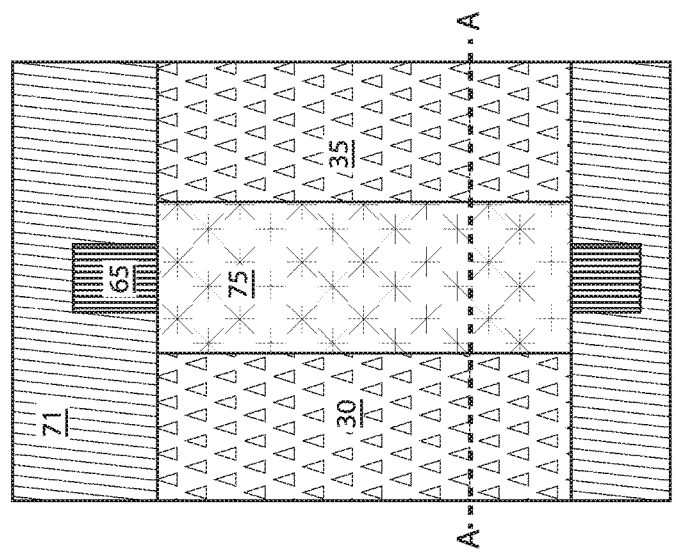
FIG. 5A is a top down view depicting one embodiment of forming an epitaxial emitter region and epitaxial collector region on opposing sides and in direct contact with the fin semiconductor structure.

FIGS. 5A and 5B depict one embodiment of forming an epitaxial emitter region 30 and epitaxial collector region 35 on opposing sides and in direct contact with the fin semiconductor structure 25. The epitaxial emitter region 30 and the epitaxial collector region 35 may be formed using a low-temperature epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface, the epitaxial film will take on a {100} orientation. The epitaxial deposition process may be carried out in the deposition chamber of a chemical vapor deposition (CVD) apparatus.

The term "low temperature" when used to describe the epitaxial deposition process denotes that the maximum temperature of the epitaxial deposition process for forming the epitaxial emitter region 30 and the epitaxial collector region 35 is 350° C. In some embodiments, the temperature of the low-temperature deposition process provided herein may range from 135° C. to 350° C. In some other embodiments, the temperature of the low-temperature deposition process may range from 150° C. to 225° C. In some other embodiments, the temperature of the low temperature deposition process may range from 175° C. to 200° C. It is noted that the aforementioned ranges of temperature is provided for illustrative purposes only. Other examples of temperatures at which the epitaxial emitter region 30 and the epitaxial collector region 35 may be equal to 140° C., 150° C., 160° C., 170° C., 180° C., 190° C., 200° C., 210° C., 220° C., 230° C., 240° C., 250° C., 260° C., 270° C., 280° C., 290° C., 300° C., 310° C., 320° C., 330° C., 340° C., and 350° C., as well as any range having an lower endpoint value provided by one of aforementioned examples, and having an upper endpoint value provided by one of aforementioned examples.

Epitaxial growth can be obtained by increasing and optimizing the hydrogen gas to silane [H2]/[SiH4] gas ratio. In one embodiment, the selective epitaxial growth of silicon (Si) is performed in a hydrogen (H2) diluted silane environment using a plasma enhanced chemical vapor deposition process (PECVD). In particularly useful embodiments, epitaxially growth of silicon begins at a gas ratio of about 5-10. The epitaxial Si quality is improved by increasing the hydrogen dilution, e.g., to 5 or greater.

In one embodiment, the epitaxial emitter region 30 and the epitaxial collector region 35 are composed of silicon that is n-type doped, e.g., monocrystalline silicon that is n-type doped. In one embodiment, the method of selective epitaxial growth of highly-doped silicon at temperatures as low as 150° C. may employ plasma enhanced chemical vapor deposition (PECVD). Silane ($SiH_4$) is only one example of a deposition gas suitable for use with low temperature epitaxial growth. Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces are produced (epitaxial silicon to crystalline silicon) and fewer stacking faults and other defects were observed.

Although plasma enhanced chemical vapor deposition (PECVD) is one apparatus suitable for providing low temperature epitaxial growth in accordance with the presently described methods and structures, in some other embodiments, to provide the low temperature epitaxial growth process, radio-frequency (RF) or direct current (DC) plasma enhanced chemical vapor deposition (CVD) is performed at deposition temperature ranges from about room temperature to about 500° C., and in some instances from about 150° C. to about 250° C.

In some embodiments employing plasma including chemical vapor deposition processes, the plasma power density for the low temperature epitaxial deposition process may range from about 2 $mW/cm^2$ to about 2000 $mW/cm^2$. A deposition pressure range may be from about 10 mtorr to about 5 torr.

The single crystalline semiconductor material that provides the epitaxial emitter region 30 and the epitaxial collector region 35 may be a type IV semiconductor material, such as germanium (Ge), silicon germanium (Ge), or silicon (Si), or may be a type III-V semiconductor material. In one example, to provide an n+ doped silicon material the epitaxial deposition process included the insitu dopant phosphorus (P) by employing phosphine ($PH_3$) gas. By "in-situ" it is meant that the dopant that dictates the conductivity type of the semiconductor material is introduced during the process step, e.g., epitaxial deposition, which forms the semiconductor material. Phosphine ($PH_3$) is only one example of a n-type dopant gas suitable for use with the methods and structures described herein. Other examples, of n-type gas dopant sources may include arsine ($A_sH_3$) and alkylphosphines, such as with the empirical formula $R_xPH_{(3-x)}$, where R=methyl, ethyl, propyl or butyl and x=1, 2 or 3. Additionally, a p-type dopant, such as borane and diborane gas, may be employed to in situ dope the low temperature epitaxially formed emitter region 30 and collector region 35.

In one example, the dopant concentration of the emitter and collector regions 30, 35 may range from $5\times10^{19}$ atoms/$cm^3$ to $1\times10^{21}$ atoms/$cm^3$. In another example, the dopant concentration of the emitter and collector regions 30, 35 may range from $2\times10^{19}$ atoms/cm3 to $5\times10^{19}$ atoms/$cm^3$.

In accordance with the above-described low temperature epitaxial deposition process, high dopant activation can be obtained at temperatures as low as 150° C. Dopant activation refers to the process of obtaining the desired electronic contribution, i.e., electrical conductivity, from impurity species introduced into a semiconductor host, through insitu doping or implantation. For example, high dopant activation, greater than $1\times10^{20}$ $cm^{-3}$ is possible when low temperature epitaxial emitter and collector regions are formed in accordance with the methods described herein, e.g., the emitter and collector regions 30, 15 being deposited at temperatures as low as at 150° C. Epitaxial Silicon can have 10% hydrogen, with deposition temperatures ranging from 150° C. to 250° C., stable for 5 min at up to 500° C.

The low temperature epitaxial deposition process for forming the epitaxial source region and the epitaxial drain region may be a selective process. By selective, it is meant that the epitaxial material, e.g., single crystalline epitaxial material grown on a single crystalline deposition surface, will grow on the exposed semiconductor sidewall surface of the semiconductor fin structure 25 that provides the base region 5, but will not grow in an epitaxial relationship with dielectric surfaces, such as the hanging spacer 75. On dielectric surfaces non-epitaxial deposited material, e.g., amorphous semiconductor material, may be formed. The non-epitaxial deposited material, such as non-crystalline, e.g., amorphous material, may be removed selectively to epitaxial semiconductor material, e.g., monocrystalline material, such as the epitaxial emitter and collector region 30, 35. The non-epitaxial deposited material may be removed by an etch process, such as etching with in $H_2$ plasma.

It is additionally noted, that amorphous semiconductor material may be formed at the interface of the epitaxially formed emitter region 30 and the buried oxide surface 20, and the interface of the epitaxially formed collector region 35 and the buried oxide surface 20.

Figure 6B:
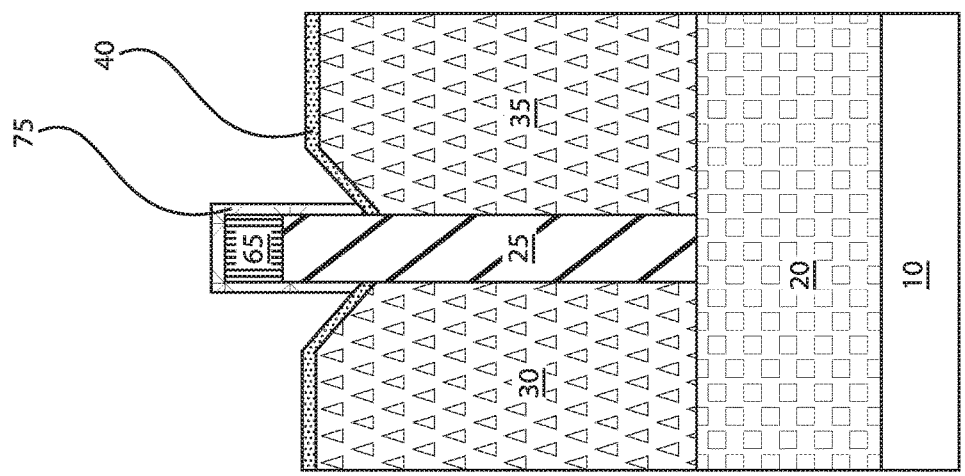
FIG. 6B is a side cross-sectional view along section line A-A of FIG. 6A.
Figure 6A:
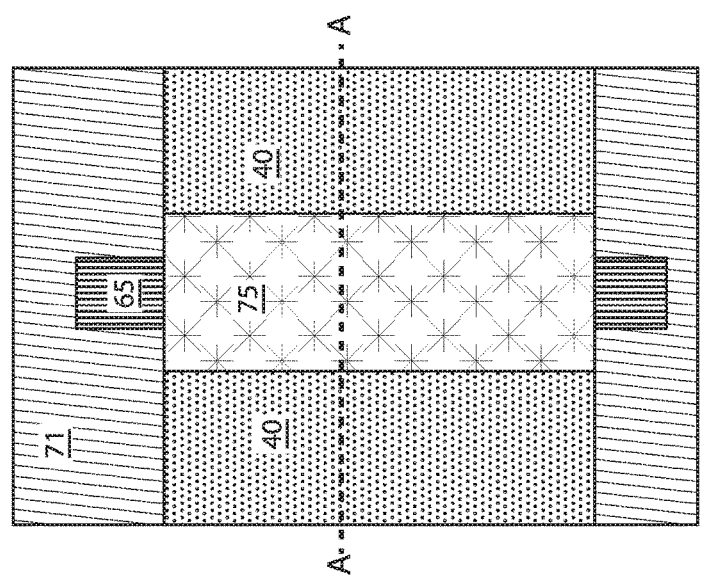
FIG. 6A is a top down view depicting one embodiment of forming a top spacer on the epitaxial emitter region and the epitaxial collector region.

FIGS. 6A and 6B depict one embodiment of forming a top spacer 40 on the epitaxial emitter region 25 and the epitaxial collector region 30. The top spacer 40 may be composed of any dielectric material, such as an oxide, nitride or oxynitride material layer. The top spacer 40 may be deposited using a chemical vapor deposition (CVD) process. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof.

FIGS. 7A-7C depict one embodiment of forming a sidewall spacer 46 on the epitaxial emitter region, the epitaxial collector region and the end portions of the semiconductor fin structure 25 that provide the base region. Forming the sidewall spacers 46 may begin with removing the mask 70 that was formed over the end portions of the semiconductor fin structure 25 that provides the base region of the device. In a following step, the sidewall spacers 46 are formed protecting the sidewalls of the epitaxial semiconductor material for the epitaxial emitter region 30, the epitaxial collector region 35, as well as the end portions of the fin structure 25. The sidewall spacers 46 may be composed of any dielectric material, such as an oxide, nitride or oxynitride material layer. The sidewall spacers 46 may be deposited using a chemical vapor deposition (CVD) process. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof.

Following encapsulation of the epitaxial collector region 30 and the epitaxial emitter region 35 in dielectric material, the sidewall spacer 46 may be removed from the end portions of the fin structures 25 using masking and selective etching.

Figure 8:
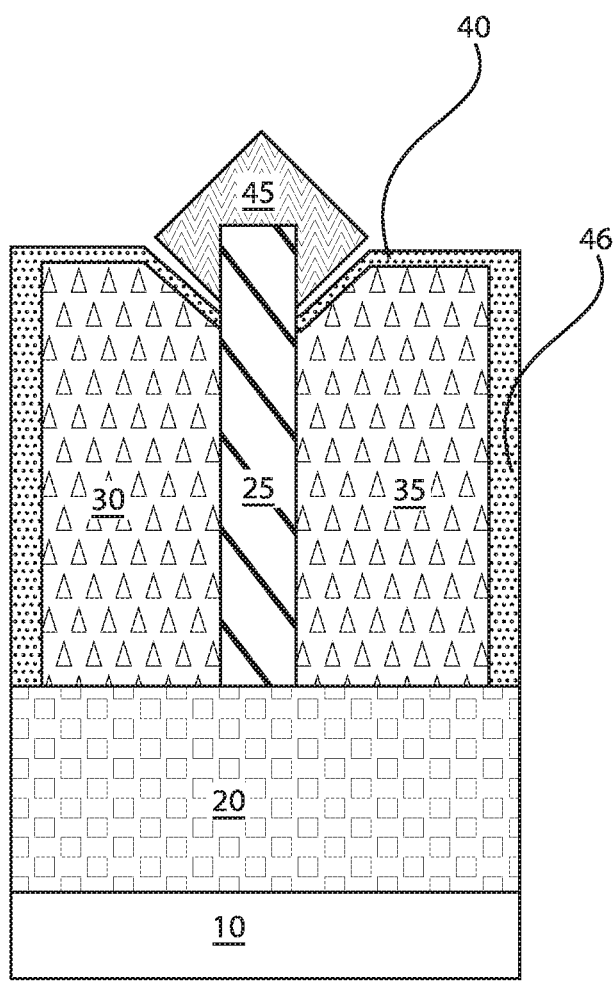
FIG. 8 is a side cross-sectional view of an extrinsic base region being formed on a base region, in accordance with one embodiment of the present disclosure.

FIG. 8 depicts one embodiment of forming an extrinsic base region 45 on the upper surface of the semiconductor fin structure 25 that provides the base region of the device. Forming the extrinsic base region 45 may begin with removing the hanging spacer 75 and removing the fin dielectric cap 65 using selective etching, which exposes the crystalline surfaces of the upper portion of the semiconductor fin structure 25 that provides the base region of the device.

The extrinsic base region 45 may be composed of a type IV or type III-V semiconductor material. The above examples of type IV and type III-V semiconductor materials described above for the semiconductor fin structure 25, the epitaxial emitter region 30 and the epitaxial collector region 35 are suitable for providing the description of some examples for the composition of the extrinsic base region 45. The extrinsic base region 45 may be formed using an epitaxial deposition process, such as the low temperature epitaxial deposition process that has been described above for forming the epitaxial emitter region 30 and the epitaxial collector region 35.

The extrinsic base region 45 of the LBJT device 100 is typically doped to the same conductivity type as the semiconductor fin structure 25 that provides the base region, but the concentration of the n-type or p-type dopant that is present in the material layer for an extrinsic base region 45 is typically greater than the dopant concentration of the n-type or p-type dopant in the semiconductor fin structure 25 that provides the base region of the LBJT. In one example, when the concentration of the n-type or p-type dopant in the base region ranges from $1\times10^{17}$ atoms/cm$^3$ to $3\times10^{19}$ atoms/cm$^3$, the concentration of the n-type or p-type dopant in the extrinsic base region 45 may range from $1\times10^{19}$ atoms/cm$^3$ to $5\times10^{21}$ atoms/cm$^3$. In another example, when the concentration of the n-type or p-type dopant in the base region ranges from $1\times10^{18}$ atoms/cm$^3$ to $5\times10^{18}$ atoms/cm$^3$, the concentration of the n-type or p-type dopant in the extrinsic base region 45 may range from $1\times10^{20}$ atoms/cm$^3$ to $1\times10^{21}$ atoms/cm$^3$. The dopant may be implanted in situ, by ion implantation, or by gas phase doping.

In a following process sequence, an interlevel dielectric 70 may be formed atop the LBJT device 100, and via contacts 50, 55, 60 may be formed to the epitaxial emitter region 30, the extrinsic base region 30 and the epitaxial collector region 35.

The interlevel dielectric layer 70 may be composed of any dielectric material, such as an oxide, nitride or oyxnitride material. For example, the interlevel dielectric layer 70 may be composed of any dielectric material used in microelectronic and nanoelectronic structures, which can include SiO$_2$, Si$_3$N$_4$, SiO$_x$N$_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 70 may be deposited using chemical vapor deposition, deposition from solution, spin on deposition and combinations thereof. Following deposition, a planarization process may be applied to the upper surface of the interlevel dielectric layer 70.

The via contacts 50, 55, 60 may be produce by forming a via opening through the interlevel dielectric layer 70; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the via contacts 50, 55, 60. The electrically conductive material may be deposited into the via opening using physical vapor deposition (PVD). Examples of PVD processes suitable for depositing the metal for the via contacts 50, 55, 60 include plating, electroplating, electroless plating, sputtering and combinations thereof.

The structures and methods disclosed herein provide an LBJT device 100 having an extremely low thermal budget less than 500° C., and in some examples less than 450° C., for the production of the entirety of the device. The low thermal budged substantially reduces dopant diffusion from the emitter and the collector regions into the base, which facilitates the formation of narrow/thin base structures for high frequency operating LBJT devices 100.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes Si$_x$Ge$_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   a base region present within a fin semiconductor structure that is present atop a dielectric substrate;
   an epitaxial emitter region and epitaxial collector region are present on opposing sides and in direct contact with the fin semiconductor structure, wherein the epitaxial emitter region and the epitaxial collector region have an upper portion comprised of a crystalline material with an interface with the dielectric substrate being non-crystalline; and
   an epitaxial extrinsic base region is present on a surface of the fin semiconductor structure that is opposite the surface of the fin semiconductor structure that is in contact with the dielectric substrate.

2. The semiconductor device of claim 1, wherein the semiconductor device is a laterally orientated bipolar junction transistor.

3. The semiconductor device of claim 1, wherein the fin structure has a width ranging from 5 nm to 10 nm.

4. The semiconductor device of claim 1, wherein the base region is doped to a first conductivity type, and the epitaxial emitter region and the epitaxial collector region are comprised of a second conductivity type.

5. A semiconductor device comprising:
   a base region present within a fin semiconductor structure that is present atop a dielectric substrate;
   an epitaxial emitter region and epitaxial collector region are present on opposing sides and in direct contact with the fin semiconductor structure; and
   an epitaxial extrinsic base region is present on a surface of the fin semiconductor substrate that is opposite the surface of the fin semiconductor structure that is in contact with the dielectric base, wherein the fin structure is comprised of a crystalline semiconductor material, and the epitaxial emitter region and the epitaxial collector region have an upper portion comprised of a crystalline material with an interface with the dielectric substrate being non-crystalline.

6. The semiconductor device of claim 5, wherein the epitaxial extrinsic base region has a same conductivity type as the base region that is present in the fin structure, wherein a dopant concentration that provides the conductivity type is higher in the epitaxial extrinsic base region than said fin structure.

7. A semiconductor device comprising:
   a base region present within a fin semiconductor structure, the base region having a width less than 15 nm;
   an epitaxial emitter region and epitaxial collector region are present on opposing sides and in direct contact with the fin semiconductor structure, wherein the epitaxial emitter region and the epitaxial collector region have an upper portion comprised of a crystalline material with an interface with the dielectric substrate being non-crystalline; and
   an epitaxial extrinsic base region is present on a surface of the fin semiconductor structure that is opposite the surface of the fin semiconductor structure that is in contact with the dielectric substrate.

8. The semiconductor device of claim 7, wherein the semiconductor device is a laterally orientated bipolar junction transistor.

9. The semiconductor device of claim 7, wherein the base region is doped to a first conductivity type, and the epitaxial emitter region and the epitaxial collector region are comprised of a second conductivity type.

10. The semiconductor device of claim 7, wherein the fin structure is comprised of a crystalline semiconductor material.

11. The semiconductor device of claim 10, wherein the epitaxial extrinsic base region has a same conductivity type as the base region that is present in the fin structure, wherein a dopant concentration that provides the conductivity type is higher in the epitaxial extrinsic base region than said fin structure.

* * * * *